United States Patent [19]

Zhao et al.

[11] Patent Number: 5,589,003
[45] Date of Patent: Dec. 31, 1996

[54] SHIELDED SUBSTRATE SUPPORT FOR PROCESSING CHAMBER

[75] Inventors: Jun Zhao, Cupertino; Frank P. Chang, San Jose; Charles N. Dornfest, Fremont, all of Calif.

[73] Assignee: Applied Materials, Inc., Santa Clara, Calif.

[21] Appl. No.: 599,015

[22] Filed: Feb. 9, 1996

[51] Int. Cl.$^6$ .................................................... C23C 16/00
[52] U.S. Cl. ........................................... 118/728; 118/500
[58] Field of Search ....................................... 118/728, 500

[56] References Cited

U.S. PATENT DOCUMENTS

| | | |
|---|---|---|
| 3,179,213 | 4/1965 | Kuehne et al. . |
| 4,078,812 | 3/1978 | Beckershoff . |
| 4,167,351 | 9/1979 | Bindin . |
| 4,668,373 | 5/1987 | Rille et al. . |
| 5,066,381 | 11/1991 | Ohta et al. . |
| 5,074,456 | 12/1991 | Degner et al. . |
| 5,161,908 | 11/1992 | Yoshida et al. . |
| 5,178,681 | 1/1993 | Moore et al. . |
| 5,238,499 | 8/1993 | van de Ven ............................. 118/728 |
| 5,257,872 | 11/1993 | Morgen et al. . |
| 5,269,894 | 12/1993 | Kerschbaumer . |
| 5,494,523 | 2/1996 | Steger ..................................... 118/728 |

FOREIGN PATENT DOCUMENTS 1-313925  12/1989  Japan .

*Primary Examiner*—Richard Bueker
*Attorney, Agent, or Firm*—James F. Hann; Michael B. Einschlag

[57] ABSTRACT

A shielded substrate support (2) for deposition chambers (6) includes a heated base (8) having a substrate support surface (16) and a sidewall (18). A corrosion-resistant base shield (10) has cover plate (14, 22) and skirt (24) portions and is used to cover and protect the support surface and a part of the sidewall during cleaning operations. The base and the base shield have first and second CTEs, the second CTE being smaller than the first CTE. The base and base shield include complementary locking surfaces sized and positioned so that only when at a higher temperature will the locking surfaces be opposite one another to prevent removal of the base shield from the base. This eliminates the need for mechanical locking elements, such as threads, pins or twist locks, which increase the cost and can be a source of particle contamination.

24 Claims, 2 Drawing Sheets

SHIELDED SUBSTRATE SUPPORT FOR PROCESSING CHAMBER

CROSS-REFERENCE TO RELATED APPLICATION

This application is related to U.S. patent application Ser. No. 08/348,273 filed Nov. 30, 1994 for CVD Processing Chamber, the disclosure of which is incorporated by reference.

FIELD OF THE INVENTION

This invention relates to the field of processing chambers which are widely used in the semiconductor industry, and in particular to a shielded substrate support finding particular utility in CVD (Chemical Vapor Deposition) processing chambers used to deposit dielectric, metal, or semiconductor layers on substrates.

BACKGROUND OF THE INVENTION

The process of depositing layers of material on a semiconductor wafer, or other substrate, usually involves heating the substrate and holding it a short distance from the source of a stream of deposition (or processing) gases. In a plasma enhanced CVD (PECVD) process, the gas is also excited to a plasma state. To deposit material on a substrate, the substrate support, also called the substrate support pedestal, is heated. The substrate support is typically made of aluminum having an anodized surface. Heating is typically needed to provide reaction energy for deposition reactions to occur.

During CVD processing, ideally the injected process gases would deposit only on the substrate surface. However, in reality some gas molecules deposit on the process chamber surfaces other than the surface of the substrate. All chamber surfaces inside the processing surface chamber are susceptible to being coated by the constituents of the deposition gases.

When the buildup of surface deposits on the inside of the processing chamber becomes thick, flakes or other particles of the deposited material can fall from the surface of the chamber onto the substrate being processed, potentially causing a defect. To avoid this problem, the inside surfaces of the processing chamber are periodically cleaned by, for example, etching (plasma cleaning) their surfaces with fluorine-containing species and oxidizer mixtures, such as $CF_4$, $NF_3$ or $C_2F_6$ and $O_2$ mixtures. Other cleaning compositions can also be used. While doing so removes the deposits, the fluorine species also attack the substrate support surface of the base of the substrate support. These cleaning sessions cause erosion, wear and nodule growth on the typically anodized aluminum surface of the substrate support. Furthermore, variations in the quality of the anodization or other corrosion resistant coating on the support surface of the substrate support can result in undesirable differences in electrical and chemical (insulating) properties across the support surface; these differences can cause undesirable variations in the plasma which can contribute to non-uniform deposition on the wafer or the substrate's surface.

Bare aluminum surfaces can also be used for the support surface of the substrate support. However, such bare aluminum surfaces are subject to attack by the fluorine-containing species and oxidizer mixture during the chemical cleaning; this results in an aluminum fluoride (AlF) film growth causing process parameters to drift. The aluminum fluoride film is also subject to cracking and peeling causing particle contamination within the vacuum processing chamber.

SUMMARY OF THE INVENTION

The present invention is directed to a shielded substrate support for processing chambers which protects the base of the substrate support from attack during chemical cleaning operations using a base shield. The base shield is freely removable from the base at lower temperatures but becomes locked to the base at higher temperatures due to a lower coefficient of thermal expansion (CTE) of the base shield compared to the CTE of the base.

The shielded substrate support for deposition chambers includes a base, typically made of aluminum and having a support surface and a sidewall extending downwardly from the support surface. The base has a first CTE. The support surface and at least part of the circumferential sidewall is shielded by a corrosion-resistant base shield having a cover plate portion, covering at least a portion of, and supported by, the support surface, and a skirt portion, surrounding the circumferential sidewall. At least a portion of the base shield, and preferably the entire base shield, has a second CTE which is smaller than the first CTE; the skirt portion of the base shield therefore expands less than the circumferential sidewall of the base when the base and base shield are raised from a first, lower temperature, to a second higher temperature, such as 40° C. to 400° C.

The base and base shield include complementary locking surfaces positioned so that when at the second, higher temperature, the locking surfaces are opposite one another to prevent removal of the base shield from the base. However, the locking surfaces are sized and positioned so that they are offset from one another when the base and base shield are at the first, lower temperature to permit removal of the base shield from the base at the lower temperature. Thus, the base shield is prevented from removal from the base when at the second, higher temperature during use of the deposition chamber without the need for mechanical locking elements, such as threads, pins or twist locks, which increase the cost of the device and can be a source of particle formation, which is to be avoided in the deposition chamber environment.

The base shield is preferably corrosion-resistant to resist attack by cleaning compositions. However, the base shield need not be of a corrosion-resistant material; in such case the base shield could be replaced, for example, after each cleaning cycle.

The cover plate portion of the base shield is preferably made of an aluminum nitride ceramic material having high thermal conductivity so that the thermal energy of the heated base can be transferred through the base shield to heat the wafer or other substrate being processed. The cover plate portion of the base shield preferably has a generally uniform thickness to provide a generally uniform impedance to aid uniform deposition of material onto the substrate.

A primary advantage of the invention is that by providing a shield to protect the substrate support base from corrosion during cleaning processes, the life of the substrate support base is extended. Another advantage of the invention is that the shield protects the support surface of the substrate support base from fluorine-containing species of cleaning gases so well that often no anodization or other corrosion-resisting coating is needed. The support surface of the base can be pure aluminum; this permits the support surface to be polished to a higher smoothness than available with anodized surfaces. The smoother surface permits better and more uniform thermal and electrical coupling between the substrate support and the substrate supported on the shield. Better temperature and electrical uniformity results in better uniformity of the film deposited on the substrate.

Other features and advantages of the invention will appear from the following description in which the preferred embodiment has been set forth in detail in conjunction with the accompanying drawings.

DESCRIPTION OF THE PREFERRED EMBODIMENT

Figure 1:
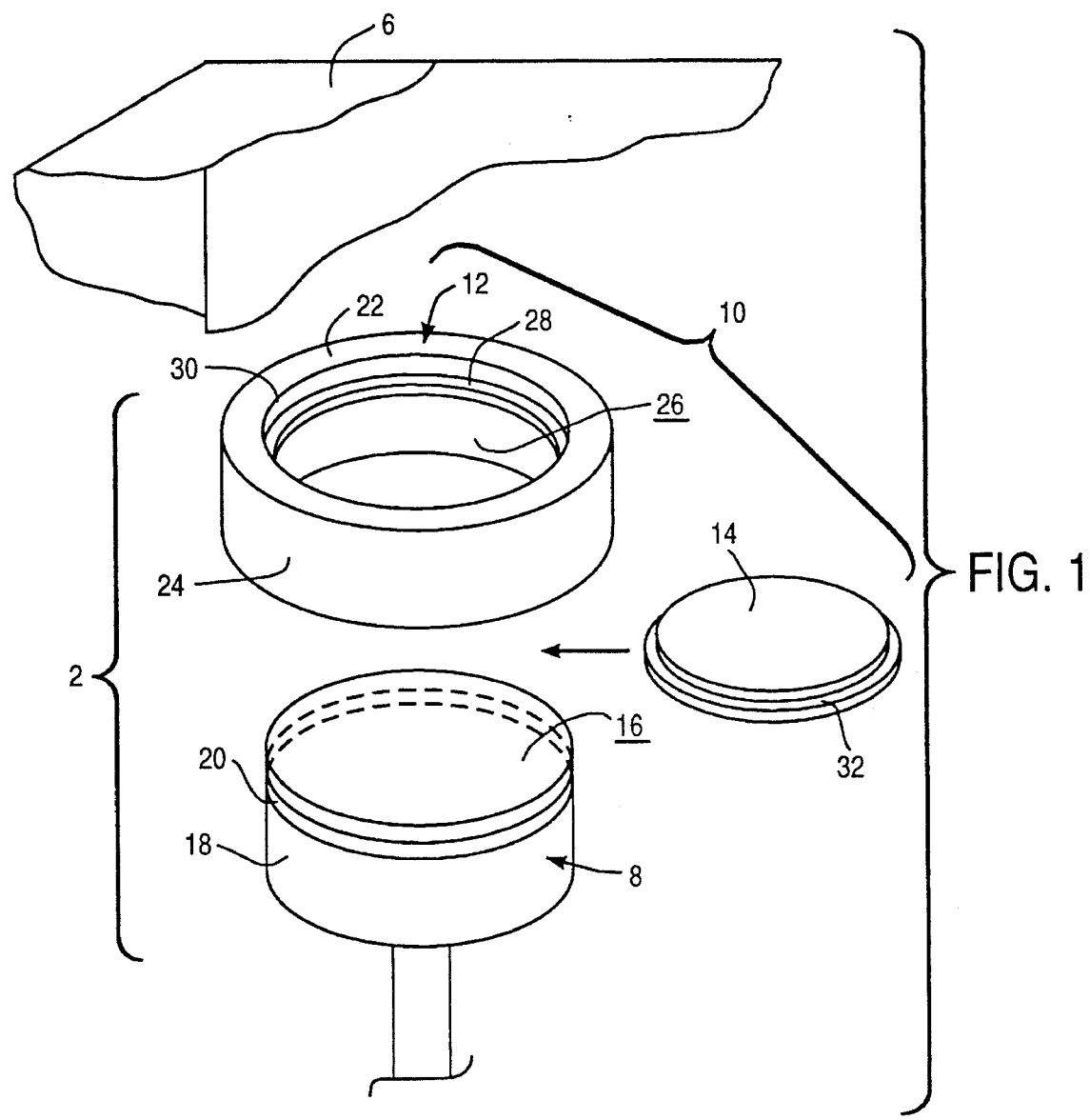
FIG. 1 is an exploded isometric view of a shielded substrate support made according to the invention shown in conjunction with a portion of a vacuum chamber housing used to enclose the chosen substrate support and a lift shaft used to support the shielded substrate support within the chamber housing.

FIG. 1 illustrates a shielded substrate support 2 in conjunction with a lift shaft 4 used to position support 2 within the interior of a chamber housing 6. Support 2 includes a substrate support base 8, typically made of aluminum, and a corrosion-resistant base shield 10. Base shield 10 is, in the preferred embodiment, made of two parts, an edge part 12 and a central part 14.

Base 8 includes a highly polished support surface 16 which, because of the presence of base shield 10, need not be anodized but may be left as pure aluminum. Base 8 also includes a circumferential sidewall 18 extending downwardly from support surface 16. In the preferred embodiment circumferential sidewall 18 is generally cylindrical and has an annular groove 20 formed therein.

Figure 2:
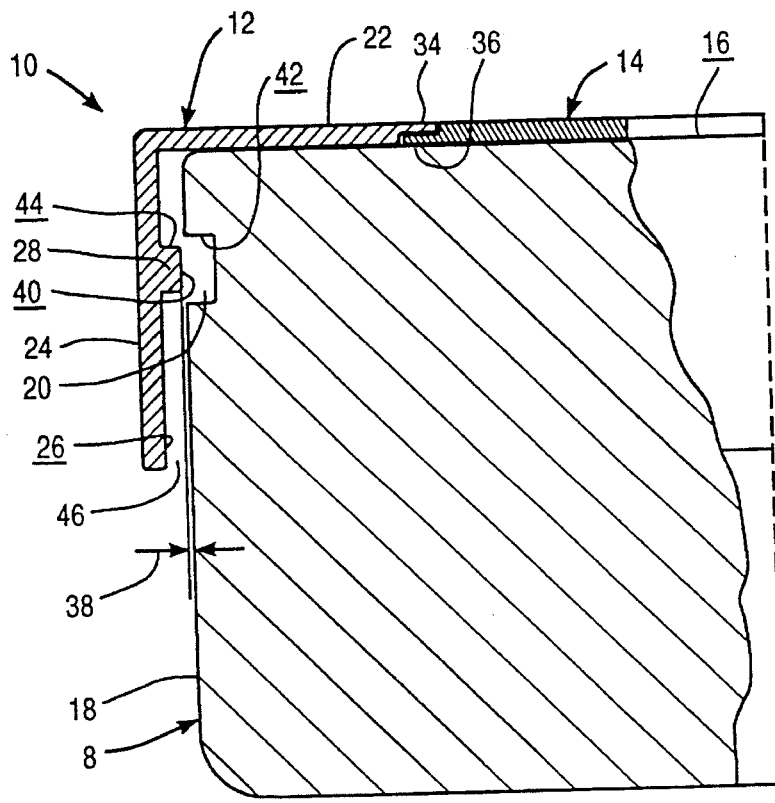
FIG. 2 is a cross-sectional view of a portion of the shielded substrate support of FIG. 1 shown in an assembled condition at a first, lower temperature;.

Edge part 12 of base shield 10 has an L-shaped cross-sectional shape, see FIG. 2, and includes an annular portion 22 and a lower, generally cylindrical skirt portion 24. Skirt portion 24 has an inner surface 26 from which a rim 28 extends. Rim 28 is positioned to be in opposition to groove 20 when base shield 10 is mounted on and supported by base 8 as shown in FIG. 2. FIG. 2 also illustrates the overlapping intersection between the inner circumferential edge 30 (identified in FIG. 1) of annular portion 22 and the outer circumferential edge 32 of central part 14. A portion 34 of edge 30 overlies a portion 36 of edge 32, see FIG. 2, so that edge part 12 of base shield 10 keeps central part 14 pressed against support surface 16.

Figure 3:
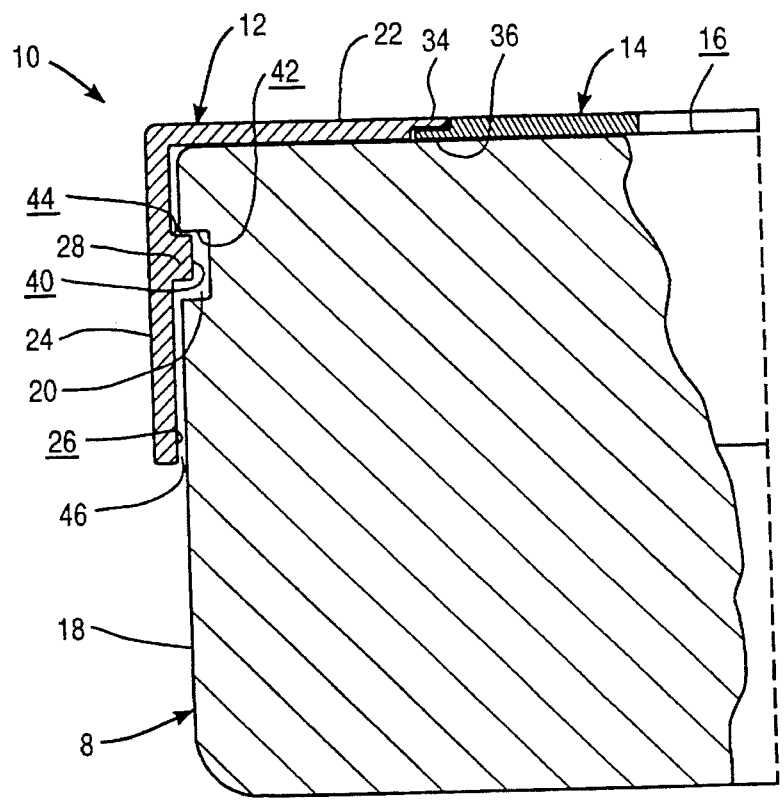
FIG. 3 shows the shielded substrate support of FIG. 2 at a second, higher temperature.

As seen in FIG. 2, a gap 38 exists between the innermost surface 40 of rim 28 and circumferential sidewall 18 when the components are at a first, lower temperature, such as 40° C. FIG. 3 illustrates the same components after the components have been raised to a second, higher temperature of, for example, approximately 350°–400° C. In this case, it is seen that innermost surface 40 of rim 28 has entered into groove 20 causing first and second locking surfaces 42, 44 to oppose one another to prevent edge part 12, and thus central part 14, of base shield 10 from being dislodged from base 8. As can be seen in FIGS. 2 and 3, first locking surface 42 is a part of base 8 and partially defines groove 20 while second locking surface 44 is a part of rim 28. Locking occurs because the coefficient Of thermal expansion (CTE) of base 8, being aluminum in the preferred embodiment, is greater than the CTE of edge part 12A. Base shield 10 in the preferred embodiment, is a corrosion-resistant, dielectric shield having a lower CTE from that of base 8. Central part 14 is preferably made of a ceramic material, and more preferably is made of an aluminum nitride ceramic material. Aluminum nitride ceramic is a preferred material because it has high thermal conductivity, excellent corrosion resistance and excellent tolerance of thermal shock. However, aluminum nitride ceramic is very expensive to fabricate, and is not easy to fabricate a single piece which covers both the top and sides of base 8. Since high thermal conductivity is not needed in the material shielding those portions of base 8 which do not directly underlie the substrate undergoing processing, edge part 12 need not be made from aluminum nitride (AlN) ceramic. Rather, edge part 12 is preferably made of aluminum oxide ceramic ($Al_2O_3$).

As can be seen in both FIGS. 2 and 3, a gap 46, 46A exists between inner surface 26 of skirt portion 24 and circumferential sidewall 18. Gap 46, 46A is sized to be large enough to permit relatively easy mounting and dismounting of shield 10 to and from base 8 but small enough to substantially shield base 8 from contact with corrosive process gases even before base 8 has been heated sufficiently to expand to the condition of FIG. 3.

In use, base 8 has base shield 10 mounted onto support surface 16 when at a lower temperature, such as 40° C. During processing at higher temperatures such as 400° C. base 8 expands more than base shield 10 due to its greater CTE so that rim 28 enters groove 20 as shown in FIG. 3, thus locking the base shield to the base. Therefore, if the substrate tends to stick to base shield 10 due to, for example, electrostatic attraction or mechanical interference with lift pins, base shield 10 will not be dislodged from base 8. Due to the simple nature of the interlock provided by the opposed first and second locking surfaces 42, 44 at the higher processing temperatures, the invention provides a very simple way of locking the base shield to the base during use at higher processing temperatures while eliminating sources of particle contamination which could occur when using mechanical locking methods, such as pins, threads or twist lock mechanisms.

It may be possible to eliminate center part 14 of base shield 10. This would leave support surface 16 bare so that the substrate could be supported directly on the support surface. For plasma cleaning, a ceramic wafer (not shown) could be placed on support surface 16 to protect the support surface.

Figure 4:
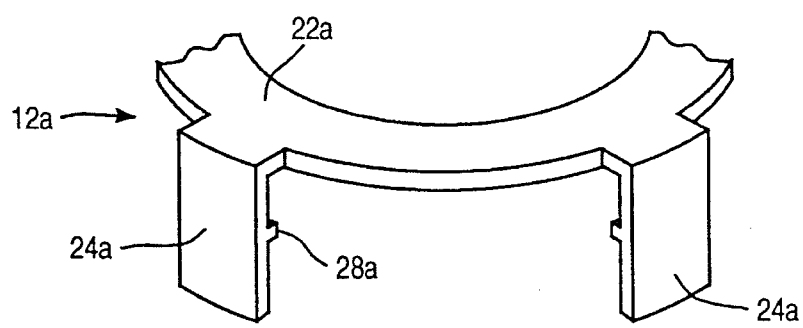
FIG. 4 shows a portion of an alternative edge part of FIG. 1 having a segmented skirt portion.

FIG. 4 illustrates a segment of an edge part 12A having a segmented skirt portion 24A. With this embodiment the lower CTE of skirt portion 24A of edge part 12A causes rim 28A to expand less than the opposed sidewall 18 of base 8.

The embodiments of FIG. 1 and 4 could be constructed with skirt portions 24, 24A made of different materials from annular portions 22, 22A. In such cases skirt portions 24, 24A could have CTE's less than, the same as, or in some cases even greater than the CTE of base 8. What matters is that the effective CTE of rim 28, 28A be less than the effective CTE of base 8 at groove 20 so that base 8 at groove 20 expands more than rim 28, 28A when both are heated.

Modifications and variation can be made to the disclosed embodiments without departing from the subject of the invention as defined in the following claims. For example, base 8 could be made of materials other than aluminum. Opposed surfaces 42, 44 could be other than flat annular surfaces; for example, rim 28 could be generally hemispherical in cross-section or surfaces 42, 44 could be upwardly and inwardly tapered surfaces. Neither groove 20 nor rim 28 need be continuous. Skirt portion 24 could have groove 20 formed in surface 26 and sidewall 18 could have rim 28 formed thereon. The invention can find applicability to chambers other than CVD chambers.

What is claimed is:

1. A base shield, for use with a substrate support base of a processing chamber of the type having a support surface and a sidewall, the sidewall of the support base having a first effective coefficient of thermal expansion (CTE), the base shield comprising:

a cover plate portion at least partially covering and supported by the support surface;

a skirt portion adjacent to said sidewall;

the skirt portion comprising a locking surface opposite the sidewall of the substrate support base;

said locking surface of said skirt portion having a second effective CTE; and said second effective CTE being smaller than said first effective CTE.

2. The base shield according to claim 1 wherein the skirt portion is made of a corrosion resistant material.

3. The base shield according to claim 1 wherein the skirt portion is an unbroken circumferential member.

4. The base shield according to claim 1 wherein the skirt portion is a segmented member.

5. The base shield according to claim 1 wherein said skirt portion has a CET equal to said second effective CTE.

6. The base shield according to claim 1 wherein the cover plate portion covers all of the support surface.

7. The base shield according to claim 1 further comprising:

an edge part, said edge part comprising said skirt portion and an outer annular portion of said cover plate portion; and a central part, said central part comprising said cover plate portion less said outer annular portion.

8. The base shield according to claim 7 wherein the edge part is made of an aluminum oxide ceramic material and the central part is made of an aluminum nitride ceramic material.

9. The base shield according to claim 7 wherein the edge and central parts have mating edges.

10. The support according to claim 7 wherein the edge and central parts have overlapping adjacent edges, the edge of the edge part overlying the edge of the central part.

11. A base shield, for use with a substrate support base of a vacuum processing chamber of the type having a support surface and a sidewall, the sidewall of the support base having a first coefficient of thermal expansion (CTE), the base shield comprising:

a cover plate portion at least partially covering and supported by the support surface;

a skirt portion adjacent to said sidewall;

said skirt portion having a second, effective CTE;

said second CTE being smaller than said first CTE so that said skirt portion of said base shield expands less than the circumferential sidewall of said base when said base and base shield are raised from a first, lower temperature to a second, higher temperature; and the base shield comprising a locking surface opposite the sidewall of the substrate support base;

whereby, when the substrate support base and said base shield are at the second, higher temperature the base shield is secured to the base, and when the base and base shield are at the first, lower temperature the base shield is removable from the base due to the differences between the first CTE and second, effective CTE.

12. A shielded substrate support for processing chambers comprising:

a substrate support base having a support surface and a sidewall;

said sidewall of said base having a first effective coefficient of thermal expansion (CTE);

a base shield having a cover plate portion, at least partially covering and supported by the support surface, and a skirt portion adjacent to said sidewall;

the sidewall of said base and the skirt portion of the base shield comprising respective first and second locking surfaces;

said skirt portion of said base shield having a second effective CTE; and said second CTE being smaller than said first CTE.

13. The support according to claim 12 wherein said base is made of aluminum.

14. The support according to claim 12 wherein said sidewall defines a surface of revolution.

15. The support according to claim 14 wherein said sidewall is generally cylindrical.

16. The support according to claim 12 wherein the base shield is made of a dielectric material.

17. The support according to claim 12 wherein at least a portion of the cover plate portion is made of an aluminum nitride ceramic material.

18. The support according to claim 12 wherein the first locking surface is an annular surface partially defining a groove formed in said base.

19. The support according to claim 18 wherein the first locking surface is a planar annular surface.

20. The support according to claim 12 wherein the second locking surface is formed on an inwardly extending annular rim of the base shield.

21. A shielded substrate support for vacuum processing chambers comprising:

a substrate support base having a support surface and a sidewall extending from the support surface;

said sidewall of the base having a first coefficient of thermal expansion (CTE);

a corrosion-resistant base shield having a cover plate portion, at least partially covering and supported by the support surface, and a skirt portion, adjacent to said sidewall;

said skirt portion of said base shield having a second, effective CTE;

said second, effective CTE being smaller than said first CTE so that said skirt portion of said base shield expands less than the sidewall of said base when said base and base shield are raised from a first, lower temperature to a second, higher temperature; and the base and the base shield comprising first and second locking surfaces positioned opposite one another when said base and said base shield are at the second, higher temperature to prevent removal of the base shield from the base when at said second temperature, said first and second locking surfaces positioned offset from one another when the base and base shield are at the first, lower temperature to permit removal of the base shield from the base when at the first temperature due to the differences between the first CTE and the second, effective CTE.

22. The support according to claim 21 wherein said first and second temperatures are about 40° C. and about 350°–400° C., respectively.

23. A shielded substrate support for vacuum processing chambers comprising:

a substrate support base having a support surface and a circumferential sidewall extending from the support surface;

said base having a first coefficient of thermal expansion (CTE);

a corrosion-resistant base shield having a cover plate portion, covering and supported by the support surface, and a skirt portion, surrounding said circumferential sidewall;

said skirt portion of said base shield having a second CTE;

said second CTE being smaller than said first CTE so that said skirt portion of said base shield expands less than the circumferential sidewall of said base when said base and base shield are raised from a first, lower temperature of about 40° C. to a second, higher temperature of about 350°–400° C.;

the base and the base shield comprising first and second locking surfaces positioned opposite one another when said base and said base shield are at the second, higher temperature to prevent removal of the base shield from the base when at said second temperature, said first and second locking surfaces positioned offset from one another when the base and bore shield are at the first, lower temperature to permit removal of the base shield from the base when at the first temperature due to the differences between the first and second CTEs; and said base shield comprising:

an edge part, said edge part made of aluminum oxide ceramic material and comprising said skirt portion and an outer annular portion of said cover plate portion; and a central part, said central part made of aluminum nitride ceramic material comprising said cover plate portion less said outer annular portion; and the edge and central parts having respective inner and outer edges, said inner edge overlapping said outer edge.

24. A processing chamber comprising:

a chamber housing;

a shielded substrate support, housed within the chamber housing, comprising:

a substrate support base having a support surface and a sidewall;

said sidewall of said base having a first effective coefficient of thermal expansion (CTE);

a base shield having a cover plate portion, at least partially covering and supported by the support surface, and a skirt portion adjacent to said sidewall;

the sidewall of said base and the skirt portion of the base shield comprising respective first and second locking surfaces;

said skirt portion of said base shield having a second effective CTE; and said second CTE being smaller than said first CTE.

* * * * *